United States Patent
Yajima et al.

(10) Patent No.: US 7,834,446 B2
(45) Date of Patent: Nov. 16, 2010

(54) ELECTRONIC DEVICE AND METHOD FOR COPING WITH ELECTROSTATIC DISCHARGE

(75) Inventors: Takashi Yajima, Fukaya (JP); Masayuki Gamou, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 12/415,657

(22) Filed: Mar. 31, 2009

(65) Prior Publication Data

US 2010/0052158 A1 Mar. 4, 2010

(30) Foreign Application Priority Data

Sep. 3, 2008 (JP) ............................ P2008-226421

(51) Int. Cl.
*H01L 23/40* (2006.01)
(52) U.S. Cl. ................. 257/712; 257/718; 257/E23.083
(58) Field of Classification Search ................. 257/712, 257/718, E23.083; 29/428
See application file for complete search history.

(56) References Cited

U.S. PATENT DOCUMENTS

| 6,353,537 | B2 | 3/2002 | Egawa |
| 2008/0055861 | A1 | 3/2008 | Nagareda et al. |

FOREIGN PATENT DOCUMENTS

| JP | 54-34054 | 3/1979 |
| JP | 63-108689 | 5/1988 |
| JP | 03-272599 | 12/1991 |
| JP | 05-267494 | 10/1993 |
| JP | 07-202084 | 8/1995 |
| JP | 09-064572 | 3/1997 |
| JP | A-2000-183256 | 6/2000 |
| JP | 2001-015186 | 1/2001 |
| JP | 2002-093928 | 3/2002 |
| JP | A-2002-203937 | 7/2002 |
| JP | A-2006-80453 | 3/2006 |
| JP | A-2006179610 | 7/2006 |
| JP | A-2008-60358 | 3/2008 |

OTHER PUBLICATIONS

Japanese Office Action dated Jun. 9, 2009; Japanese Patent Application No. 2008-226421.
Japanese Office Action dated Jan. 5, 2010, Japanese Patent Application No. 2009-266963.

*Primary Examiner*—Roy K Potter
(74) *Attorney, Agent, or Firm*—Patterson & Sheridan, L.L.P.

(57) ABSTRACT

According to an aspect of the present invention, there is provided an electronic device including: a substrate board; a semiconductor device mounted on the substrate board; a heat sink configured to radiate heat from the semiconductor device; a first conductive portion provided on the substrate board; and a second conductive portion provided on the substrate board, the second conductive portion separated from the first conductive portion by a discharge gap, wherein: the heat sink is electrically connected to the first conductive portion; and the second conductive portion is grounded.

8 Claims, 4 Drawing Sheets

ELECTRONIC DEVICE AND METHOD FOR COPING WITH ELECTROSTATIC DISCHARGE

CROSS-REFERENCE TO RELATED APPLICATIONS

This application is based upon and claims the benefit of priority from Japanese Patent Application No. 2008-226421, filed on Sep. 3, 2008, the entire contents of which are incorporated herein by reference.

BACKGROUND

1. Field

An aspect of the present invention relates to an electronic device having a heat sink and a method for coping with static electricity.

2. Description of the Related Art

In recent, heat values during operation have been increasing every year since semiconductor devices having a high process speed (e.g., CPU) are demanded for digital media apparatuses such as a digital TV. Excessively heated high-temperature semiconductor devices may malfunction. Accordingly, semiconductor devices with high power consumption and high heat values have been provided with a high sink. Generally, heat sinks are made of metal having high thermal conductivity such as aluminum, and are fixed onto semiconductor devices.

In JP-A-2000-183256, a structure where a heat sink is pressed and fixed onto a semiconductor device using a spring member is described.

Since the heat sink is a conductive element and may be the route of electric charges, the heat sink may serve as a discharge place of static electricity and noise. Accordingly, when electrostatic discharge (ESD) occurs, static electricity having no place to go are discharged to a terminal or the like of the neighboring semiconductor device through the heat sink, and thus the neighboring semiconductor device may be seriously damaged (destruction, malfunction, etc. of semiconductor device).

To avoid the ESD problem, the heat sink has been connected to a ground potential (GND) (see JP-A-2006-80453). According to this technique, since the static electricity discharged to the heat sink flows into the GND having electric potential lower than that of the semiconductor device, the semiconductor device is hardly damaged.

An ESD countermeasure is important in addition to the heat radiation countermeasure when the heat sink is provided, as described above. However, when the heat sink is connected to the GND as described above, undesired radiation may increase. That is, even if the heat sink is connected to the GND, it may be hard to say that the heat sink is ideally connected to the GND since the GND around the semiconductor device has relatively large noise. Therefore, undesired radiation occurs by connecting the heat sink to the GND, and electromagnetic interference with external electronic devices (e.g., radio, etc.), such as noise and the like may be generated. In an area where undesired radiation is strictly controlled, the standard may fail to be satisfied.

BRIEF DESCRIPTION OF THE SEVERAL VIEWS OF THE DRAWINGS

A general architecture that implements the various feature of the present invention will now be described with reference to the drawings. The drawings and the associated descriptions are provided to illustrate embodiments of the present invention and not to limit the scope of the present invention.

DETAILED DESCRIPTION

Various embodiments according to the present invention will be described hereinafter with reference to the accompanying drawings. In general, according to one embodiment of the present invention, there is provided an electronic device including: a substrate board; a semiconductor device mounted on the substrate board; a heat sink configured to radiate heat from the semiconductor device; a first conductive portion provided on the substrate board; and a second conductive portion provided on the substrate board, the second conductive portion separated from the first conductive portion by a discharge gap, wherein: the heat sink is electrically connected to the first conductive portion; and the second conductive portion is grounded.

Figure 1:
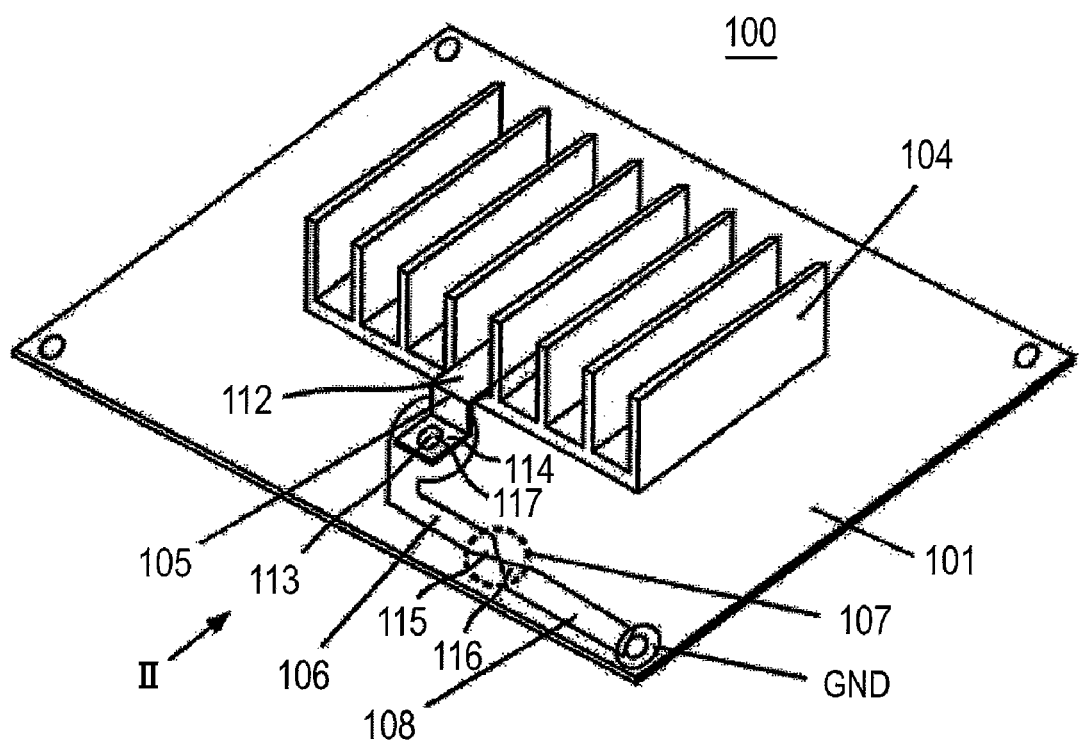
FIG. 1 is an exemplary perspective view illustrating an appearance of an electronic device according to an embodiment.
Figure 2:
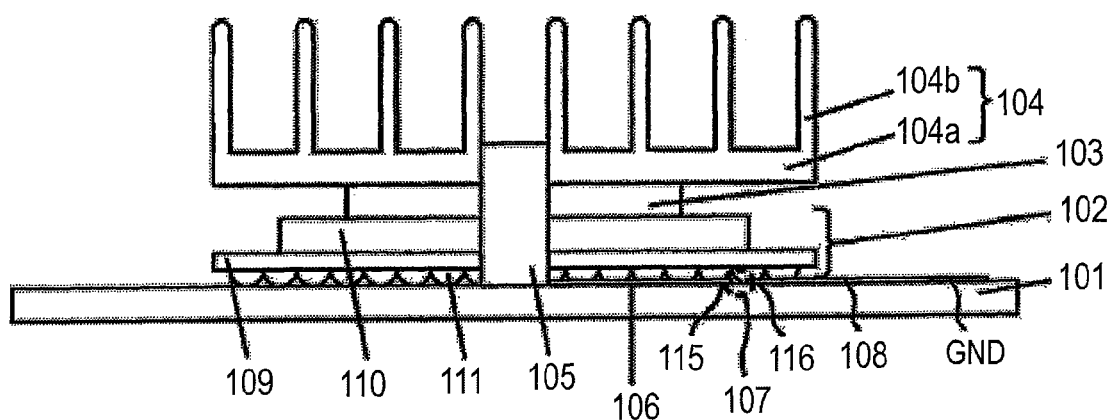
FIG. 2 is an exemplary sectional view illustrating an electronic device according to the embodiment.

Hereinafter, an embodiment of the invention will be described with reference to the drawings. As an example of the embodiment, FIG. 1 is a perspective view illustrating a configuration of a part of a printed board unit (electronic device 100), in which a semiconductor device provided with a heat sink fixed thereto is mounted on a printed board. FIG. 2 is a view illustrating the printed board unit viewed from a direction indicated by the arrow II in FIG. 1.

As shown in FIG. 1 and FIG. 2, the electronic device 100 mainly includes a printed board 101, a semiconductor device 102 mounted on the printed board 101, a heat sink 104 provided on the semiconductor device 102 with a thermal conductive sheet 103 therebetween, a fixture 105 for fixing the heat sink 104 to the printed board 101, a copper foil layer 106 provided on the printed board 101 and electrically connected to the fixture 105, and a copper foil layer 108 provided on the printed board 101, wherein a discharge gap 107 provided between the copper foil layer 106 and the copper foil layer 108, and one end of the copper foil layer 108 is connected to a ground potential (GND).

Although not shown, a number of electronic components such as semiconductor integrated circuits, resistors, and capacitors are mounted on the surface of the printed board 101, and the components are connected to each other by wiring.

Various types of devices may be used as the semiconductor devices (IC chips) mounted on the printed board 101. In the embodiment, as an example, a Ball Grid Array (BGA) type semiconductor device 102 is mounted. As shown in FIG. 2, the BGA type semiconductor device 102 includes a printed board 109, a semiconductor element portion 110 having a number of semiconductor elements sealed by resin, and a plurality of electrodes 111 disposed on the back face of the printed board 109 and formed of solders for input and output. The semiconductor device 102 may be formed of a single element such as a transistor.

The thermal conductive sheet 103 includes, for example, a silicon sheet or a graphite sheet having insulation or flexibility and formed of a material with high thermal conductivity.

As described above, it is preferable to dispose the thermal conductive sheet 103 between the heat sink 104 and the semiconductor device 102, in the view point of efficiently radiating heat, from the heat sink 104, generated in the semiconductor device 102 at operation. The surface of the thermal conductive sheet 103 may have an adhesive property. In such a configuration, the heat sink 104 and the semiconductor device 102 are temporarily fixed to the thermal conductive sheet 103. A double-sided tape or the like may be disposed between the thermal conductive sheet 103 and the heat sink 104 or between the thermal conductive sheet 103 and the semiconductor device 102, to fix each element.

The heat sink 104 is formed of metal having high thermal conductivity (e.g., aluminum or aluminum alloy), which is a heat radiating device for diffusing and cooling the heat generated in the semiconductor device 102 at operation. To improve efficiency of the heat radiation, a plurality of fins 104b are protruded in parallel from a substantially rectangular base substrate 104a in a vertical direction. The substrate 104a of the embodiment preferably has an area equal to or larger than that of the semiconductor device 102. To improve efficiency of heat radiation, the heat sink 104 is provided preferably in the vicinity of a desired semiconductor device. In addition, as shown in FIG. 2, the heat sink 104 is provided preferably to overlap with at least a part of the semiconductor device 102.

The fixture 105 is a member for fixing the heat sink 104 onto the printed board 101, and is made of a conductive material such as iron. The fixture 105 has a center portion 112 on which the heat sink 104 is mounted, and both ends of the center portion 112 are processed to be bended at right angle in two steps. The fixture 105 has a front end portion 114 having a screw hole 113 to be fixed to the printed board 101 by a screw.

The copper foil layer 106 and the copper foil layer 108 are conductive layers, for example, which can be formed at once when forming a number of wires on the printed board 101. They are separated from each other, thereby forming the so-called discharge gap 107. That is, one end of the copper foil layer 106 is provided around the screw hole 113 of the fixture 105 and is electrically connected to the fixture 105. The other end has a discharge portion 115. One end of the copper foil layer 108 opposite to the copper foil layer 106 has a discharge portion 116 opposite to the discharge portion 115. The other end is connected to the GND. As shown in FIG. 1, the discharge portions 115 and 116 are configured preferably to protrude in a substantially triangle shape (sharp portion), to improve a discharge characteristic. The angle of the sharp portion can be appropriately adjusted in consideration of durability.

In the embodiment, the discharge portions 115 and 116 are disposed on a line with the discharge gap 107 therebetween. As an ESD countermeasure, the size of the discharge gap 107 may be changed appropriately to smoothly discharge static electricity. The discharge gap 107 is not limited to the above-described configuration, and may be provided using a single component, for example, purchasable from a parts manufacturer.

Although not shown, the copper foil layer 106, the discharge gap 107, and the copper foil layer 108 may be provided on the opposite side of the fixture 105 in the same manner. That is, as the ESD countermeasure, they may be configured to perform discharge from the heat sink 104 using not single but a plurality of routes.

When the heat sink 104 is fixed, the fixture 105 is mounted on the heat sink 104 with the center portion 112 being passed through a groove of the adjacent fin 104b, and the screw hole 117 provided in the printed board 101 is allowed to coincide with the screw hole 113 of the fixture 105. Then, a screw is inserted into the screw holes 113 and 117, thereby fixing the heat sink 104 onto the printed board 101.

As described above, in the embodiment, the fixture 105 for fixing the heat sink 104 is connected to the copper foil layer 106 provided on the printed board 101, and the discharge gap 107 is provided between the copper foil layer 106 and the copper foil layer 108 connected to the GND. For this reason, static electricity discharged to the heat sink 104 by unexpected static electricity flows into the copper foil layer 106 provided on the printed board 101 through the fixture 105. The static electricity flows into the GND through the copper foil layer 108 over the discharge gap 107. That is, when excessive static electricity is applied to the heat sink 104, the heat sink 104 is short-circuited with the GND in the route of the fixture 105, the copper foil layer 106, the discharge gap 107, and the copper foil layer 108. Accordingly, the static electricity is sent to the GND, and thus the static electricity is not applied to the semiconductor device 102 or neighboring semiconductor devices. Therefore, this configuration can easily avoid electrostatic destruction.

Meanwhile, at normal operation, the discharge gap 107 serves as an insulator, and thus the above-described short circuit between the heat sink 104 and the GND does not occur. Accordingly, even when there is large noise around the GND, the noise does not reach the heat sink 104, thereby reducing undesired radiation.

As described above, since the heat sink 104 and the GND are securely cut off at normal operation, radiation efficiency does not deteriorate and the ESD countermeasure can be performed. In addition, since the discharge gap 107 is formed on the printed board, there is a little difference between the elements, which can be sufficiently managed.

Figure 3A:
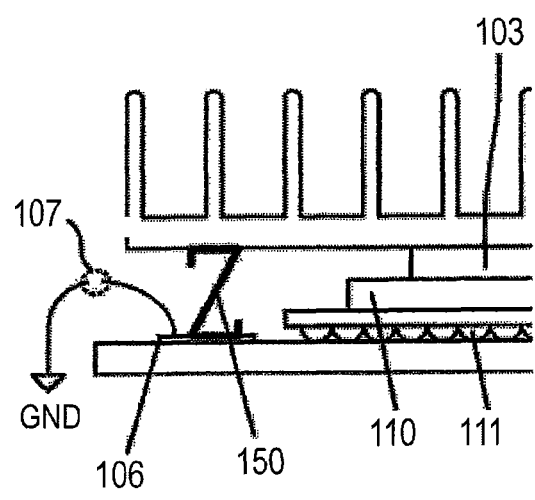
FIGS. 3A and 3B are sectional views illustrating electronic devices according to modification examples.
Figure 3B:
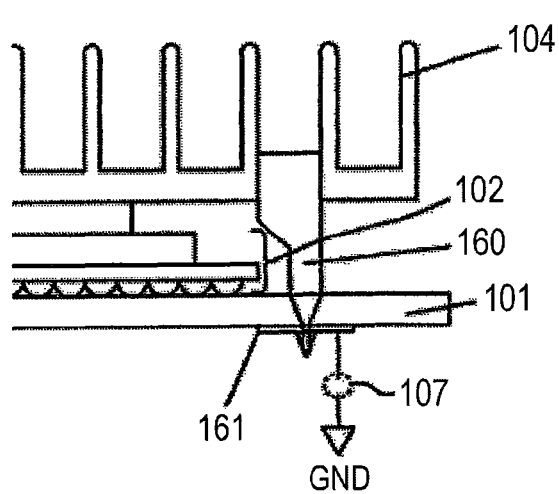

The invention is not limited to the above-described embodiment, and may be embodied by modifying the constituent elements within the scope of the invention, in the realizing step. For example, as shown in FIG. 3A, the heat sink 104 and the copper foil layer 106 are electrically connected using a metallic spring member 150, thereby obtaining the same effect (heat radiation effect, electrostatic destruction prevention, and effect of preventing undesired radiation). In addition, as shown in FIG. 3B, a conductive fixture 160 may be fixed to the printed board 101 by direct soldering not screwing. A copper foil layer 161 connected to the GND may be provided on the back surface of the printed board 101 not the front surface, and a discharge gap may be provided between the copper foil layer 161 and the GND.

In the embodiment, the conductive fixture 105 is provided, but an insulating member (e.g., plastic) may be used as the fixture 105 as long as the heat sink 104 and the copper foil layer 106 can be connected using another conductive member. That is, if the heat sink 104 is connected to any conductive member and the conductive member is connected to the GND through a discharge gap, the material of the fixture 105 or the fixture 160 may be modified appropriately. In the embodiment, the heat sink 104 and the copper foil layer 106 are electrically connected through the fixture 105. However, the heat sink 104 and the copper foil layer 106 may be directly connected according to the shape of the heat sink 104.

Figure 4:
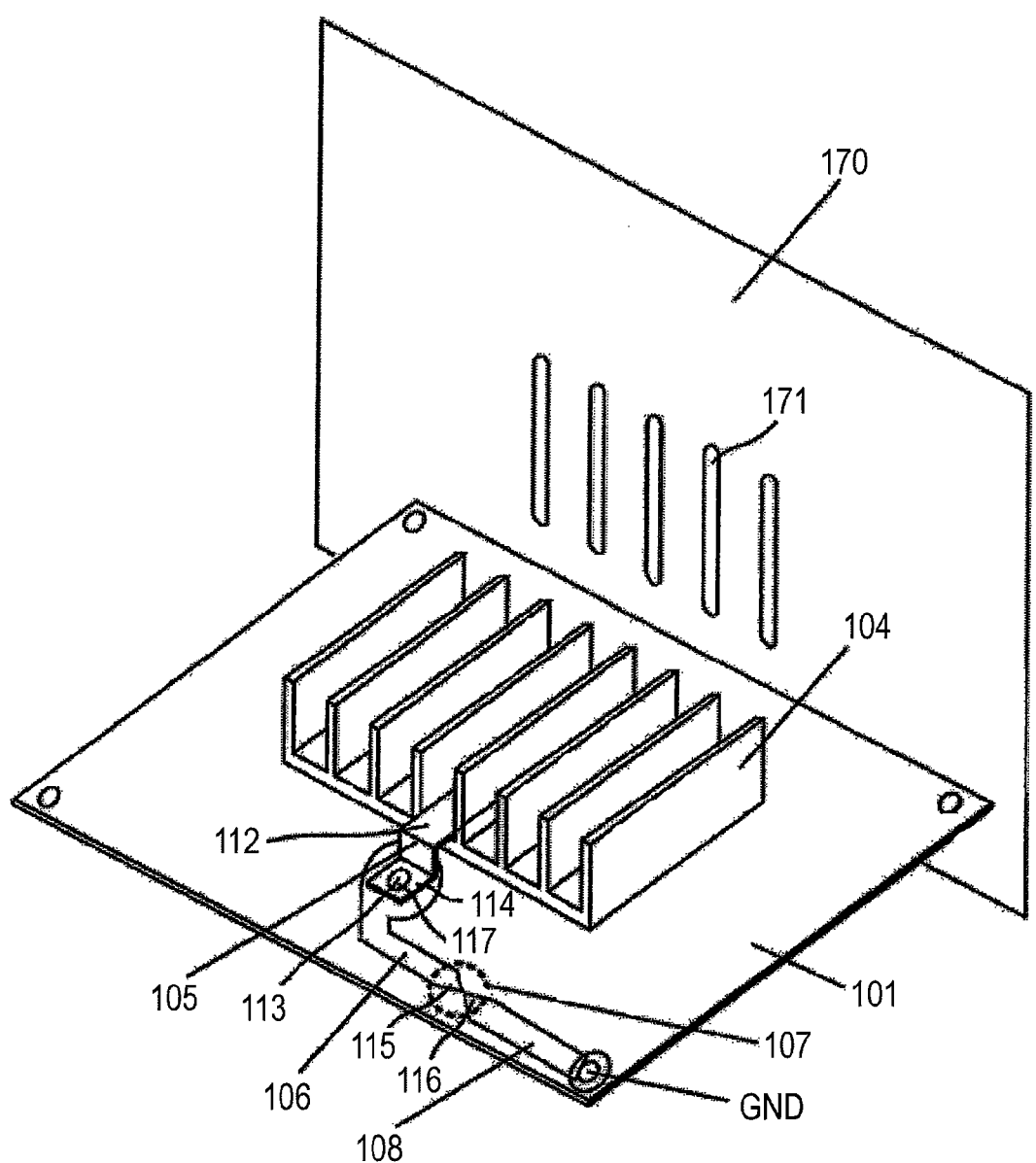
FIG. 4 is a perspective view illustrating an application example of an electronic device according to the embodiment.

The above-described electronic device 100 may be provided for various situations. For example, as shown in FIG. 4, a plurality of slits 171 are formed at a casing 170 for receiving the printed board 101, the heat sink 104, the semiconductor device 102, and the like, and the heat sink 104 may be disposed close to the slits 171. With such a configuration, the air from the outside comes into sufficient contact with the heat sink 104 through the slits 171, and thus it is possible to improve a heat radiation characteristic.

If the slits or the like are provided at the casing, for example, static electricity accumulated on a human body may be discharged to the heat sink 104 in the casing through the slits. However, in the embodiment, the ESD countermeasure is prepared as described above. In addition, a cooling fan may be provided in the vicinity of the heat sink 104 to further improve the heat radiation effect.

In the embodiment, the thermal conductive sheet 103 is disposed between the heat sink 104 and the semiconductor device 102, but the heat sink 104 and the semiconductor device 102 may be adhered and fixed by an adhesive, a double-sided tape, or the like, without the thermal conductive sheet 103.

In the embodiment, the copper foil layers 106 and 108 provided on the surface of the printed board 101 are used, but wirings having a wire shape or the like may be used. That is, various conductive patterns may be provided between the heat sink 104 and the GND.

An example of usage of the above-described configuration will be described. For example, the above-described configuration is appropriately used for a television broadcast receiver. That is, in the television broadcast receiver, a tuner module for receiving a broadcast wave (broadcast signal) is provided, and a number of circuits configuring a video signal processing system for displaying a video on a video display unit using the broadcast signal are mounted. The configuration according to the embodiment provided with the heat radiation countermeasure, the ESD countermeasure, and the undesired radiation countermeasure is very effective, particularly, for a semiconductor integrated circuit constituting a decoder unit among the various circuit components, since heat is generated by a high-speed process of digital data in the semiconductor integrated circuit.

The invention according to the embodiment may be widely applied to an electronic device in which the heat radiation measurement, the ESD measurement, and the undesired radiation measurement are necessary.

In the embodiment, the semiconductor device and the heat sink are piled up on the printed board in order. The order of the piling may be appropriately modified according to a design such as a chip structure of the semiconductor device. A member having satisfactory thermal conductivity may be separately provided between the semiconductor device and the heat sink, so that the semiconductor device and the heat sink are not disposed close to each other but separate from each other.

What is claimed is:

1. An electronic device comprising:
  a semiconductor device arranged on a substrate board;
  a heat sink arranged on the semiconductor device and cooling the semiconductor device;
  a first conductive portion arranged on the substrate board and electrically connected to the heat sink; and
  a second conductive portion arranged on the substrate board, the second conductive portion being separated from the first conductive portion by a discharge gap and being grounded.

2. The electronic device of claim 1,
  wherein the heat sink is electrically connected with the first conductive portion through a fixing member that fixes the heat sink.

3. The electronic device of claim 1,
  wherein the heat sink is electrically connected with the first conductive portion through a spring member.

4. The electronic device of claim 1, wherein
  at least one of the first conductive portion and the second conductive portion comprises a sharp portion at the discharge gap.

5. The electronic device of claim 1, further comprising a tuner module that receives a broadcast wave.

6. The electronic device of claim 1, further comprising:
  a case that accommodates the heat sink and the semiconductor device,
  wherein the case comprises a slit arranged near the heat sink.

7. The electronic device of claim 1,
  wherein the heat sink is not electrically connected with the semiconductor device.

8. The electronic device of claim 5,
  wherein the semiconductor device comprises a decoder module that decodes the broadcast wave received by the tuner module.

* * * * *